United States Patent
Yoo et al.

(10) Patent No.: US 8,824,232 B2
(45) Date of Patent: Sep. 2, 2014

(54) SEMICONDUCTOR MEMORY DEVICE AND METHOD OF OPERATING THE SAME

(71) Applicant: SK hynix Inc., Icheon-si (KR)

(72) Inventors: Byoung Sung Yoo, Seoul (KR); Jin Su Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/846,854

(22) Filed: Mar. 18, 2013

(65) Prior Publication Data

US 2014/0056081 A1 Feb. 27, 2014

(30) Foreign Application Priority Data

Aug. 24, 2012 (KR) .................. 10-2012-0093112

(51) Int. Cl.
*G11C 7/12* (2006.01)
(52) U.S. Cl.
USPC .................................................. 365/203
(58) Field of Classification Search
USPC .................................................. 365/203
See application file for complete search history.

(56) References Cited

U.S. PATENT DOCUMENTS

2008/0175076 A1* 7/2008 Hayashi et al. .......... 365/189.15

FOREIGN PATENT DOCUMENTS

| KR | 1020060104404 A | 10/2006 |
|---|---|---|
| KR | 1020100129066 A | 12/2010 |

* cited by examiner

*Primary Examiner* — Hoai V Ho
*Assistant Examiner* — Jay Radke
(74) *Attorney, Agent, or Firm* — William Park & Associates Patent Ltd.

(57) ABSTRACT

A semiconductor memory device may include a cell string configured to include memory cells, a page buffer coupled to the cell string through a bit line, and configured to include a latch for storing data to be programmed in a memory cell or data read from the memory cell, a precharge voltage generation circuit configured to generate a precharge voltage from an external voltage according to the data stored in the latch, bit line precharge circuits configured to supply the precharge voltage to the bit line in response to precharge control signals, and a control circuit configured to output the precharge control signals so that the number of enabled bit line precharge circuits increases, accordingly, as a supply number of a program voltage augments in a program operation.

20 Claims, 13 Drawing Sheets

SEMICONDUCTOR MEMORY DEVICE AND METHOD OF OPERATING THE SAME

CROSS-REFERENCE TO RELATED APPLICATION

This application claims priority from Korean Patent Application No. 10-2012-0093112, filed on Aug. 24, 2012, the contents of which are incorporated herein by reference in its entirety.

BACKGROUND

1. Technical Field

The present invention generally relates to a semiconductor memory device for performing a program operation or a read operation.

2. Related Art

A semiconductor memory device precharges a bit line in a program operation or a read operation. Loading of the bit line rises, accordingly, as integration of a memory chip increases. As a result, a time taken for precharging the bit line increases and peak current may occur.

Accordingly, a method of reducing a time taken for precharging the bit line and preventing the occurrence of peak current has been required.

SUMMARY OF THE INVENTION

Embodiments of the present invention provide a semiconductor memory device for enhancing operation performance with preventing peak current.

A semiconductor memory device according to an embodiment of the present invention includes a cell string configured to include memory cells; a page buffer coupled to the cell string through a bit line, and configured to include a latch for storing data to be programmed in a memory cell or data read from the memory cell; a precharge voltage generation circuit configured to generate a precharge voltage from an external voltage according to the data stored in the latch; bit line precharge circuits configured to supply the precharge voltage to the bit line in response to precharge control signals; and a control circuit configured to output the precharge control signals so that the number of enabled bit line precharge circuits increases in accordance with the increase in the program iteration number (the number of times a program voltage is applied) in a program operation.

A semiconductor memory device according to an embodiment of the present invention includes cell strings configured to include memory cells; page buffers coupled to the cell string through a bit line, and configured to include a latch for storing data to be programmed in a memory cell or data read from the memory cell; bit line precharge circuits configured to supply a precharge voltage to the bit line in response to precharge control signals, in the event that the data stored in the latch is first data; and a control circuit configured to output the precharge control signals so that the number of enabled bit line precharge circuits increases in accordance with the increase in the program iteration number in a program operation.

A method of operating a semiconductor memory device according to an embodiment of the present invention includes precharging a bit line of program inhibition cells of memory cells to be programmed coupled to a selected word line at bit line precharge nodes on the bit line; and supplying a program voltage to the selected word line. Here, the bit line is precharged at the bit line precharge nodes in which the number of precharge nodes increases in accordance with the increase in the program iteration number.

A semiconductor memory device of the present invention precharges a bit line using bit line precharge circuits, and increases the number of enabled bit line precharge circuits in accordance with the increase in the program iteration number or with the increase in the number of cells that are program inhibited in a program operation. Accordingly, peak current is prevented from occurring when the bit line may be precharged and operation performance of the semiconductor memory device may be enhanced.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Hereinafter, the various embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

Figure 1:
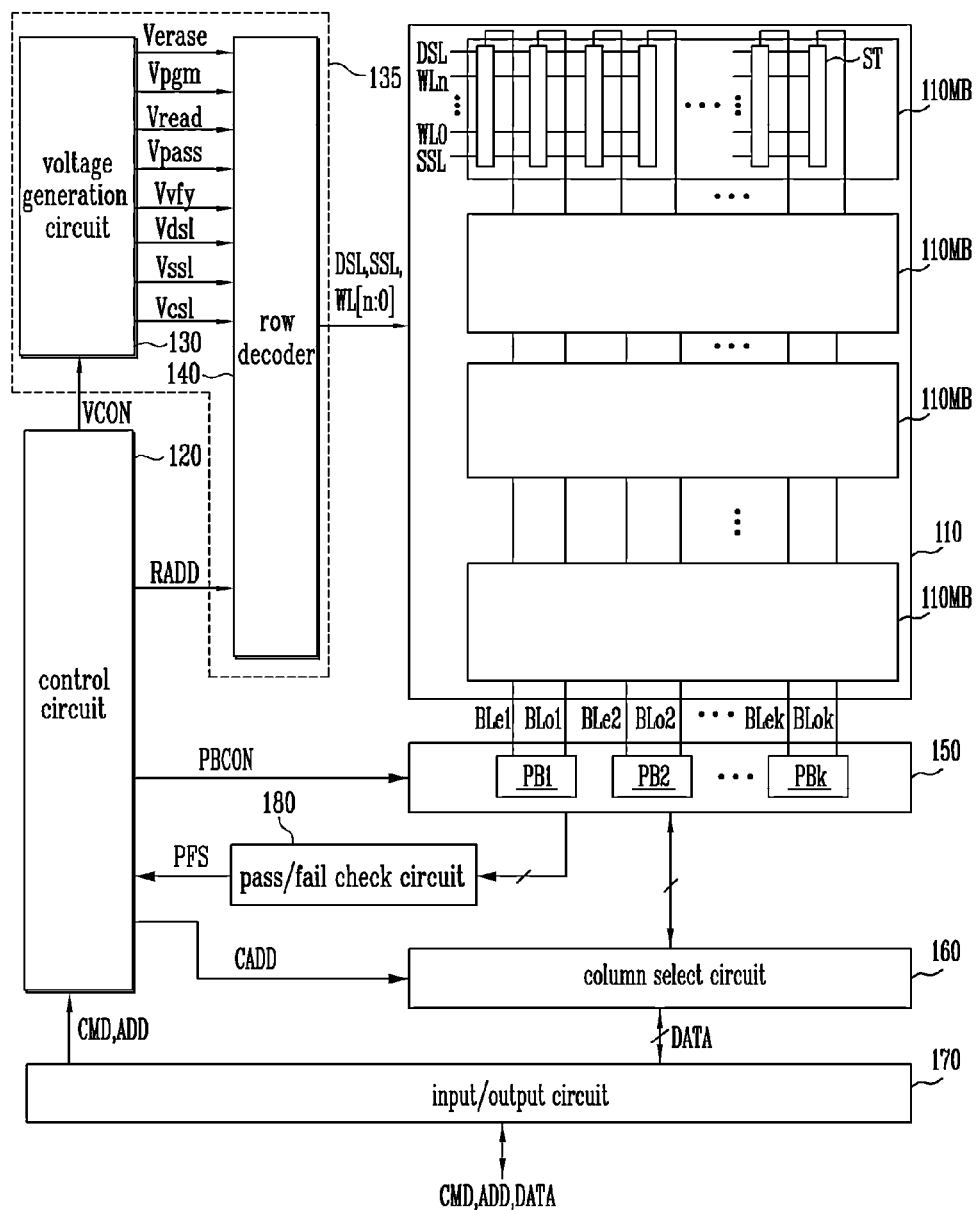
FIG. 1 is a view illustrating circuit diagram illustrating a semiconductor memory device according to an embodiment of the present invention.
Figure 2:
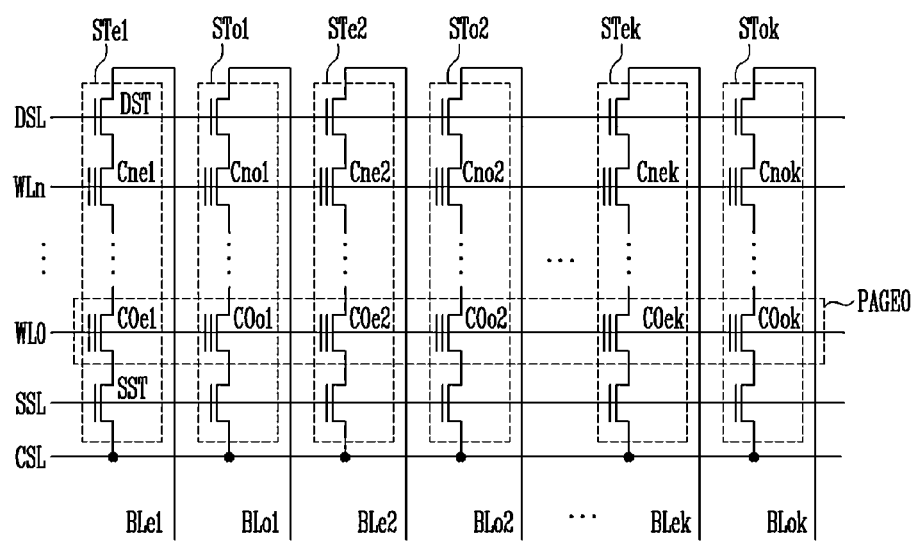
FIG. 2 is a view illustrating circuit diagram of a memory block in FIG. 1.

FIG. 1 is a view illustrating circuit diagram illustrating a semiconductor memory device according to an embodiment of the present invention. FIG. 2 is a view illustrating circuit diagram of a memory block in FIG. 1.

A semiconductor memory device of the present embodiment may include a memory array 110 having memory blocks 110MB, an operation circuit 130, 140, 150, 160, 170 and 180 for performing a program operation, a read operation and an erase operation of memory cells included in a selected page of the memory block 110MB, and a control circuit 120 for controlling the operation circuit 130, 140, 150, 160, 170 and 180. In the event that the semiconductor memory device is a NAND flash memory device, the operation circuit may include a voltage supply circuit 135, a page buffer group 150, a column select circuit 160, an input/output circuit 170 and a pass/fail check circuit 180.

The memory array 110 may include the memory blocks 110MB.

In FIG. 2, each of the memory blocks 110MB may include strings STe1~STek and STo1~STok coupled between bit lines BLe1~BLek and BLo1~BLok and a common source line CSL. That is, the strings STe1~STok may be respectively coupled to the bit lines BLe1~BLok and may be coupled in common to the common source line CSL. Each of the strings, e.g. STe1 may include a source select transistor SST, memory cells C0e1~Cne1 and a drain select transistor DST. A source of the source select transistor SST may be coupled to the common source line CSL, and a drain of the drain select transistor DST may be coupled to the bit line, e.g. BLe1. The memory cells C0e1~Cne1 may be coupled in series between the select transistors SST and DST. A gate of the source select transistor SST may be coupled to a source select line SSL, gates of the memory cells C0e1~Cne1 may be respectively coupled to word lines WL0~WLn, and a gate of the drain select transistor DST is coupled to a drain select line DSL.

Memory cells included in the memory block of a NAND flash memory block may be divided into a physical page or a logical page. For example, the memory cells C0e1-C0ek or C0o1-C0ok coupled to one word line, e.g. WL0 form one physical page PAGE0. Even-numbered memory cells C0e1-C0ek coupled to one word line, e.g. WL0 may form one even physical page, and odd-numbered memory cells C0o1-C0ok may form one odd physical page. The page (even page or odd page) is the unit of a program and read operation. FIG. 2 also illustrates memory cells Cne1-Cnek and Cno1-Cnok.

Now referring to FIG. 1 and FIG. 2, the control circuit 120 outputs a voltage control signal VCON, for generating voltages needed for performing a program operation, a verify operation or a read operation, in response to a command signal CMD inputted from an external device through the input/output circuit 170, and outputs a PB control signals PBCON for controlling page buffers PB1~PBk included in the page buffer group 150 according to the kind of the operations. An operation of controlling the page buffer group 150 through the control circuit 120 will be described below. The control circuit 120 outputs a row address signal RADD and a column address signal CADD in response to an address signal ADD inputted from an external device through the input/output circuit 170.

The voltage supply circuit 135 supplies operation voltages, e.g. Verase, Vpgm, Vread, Vpass, Vvfy, Vdsl, Vssl and Vcsl needed for the program operation, the read operation and the erase operation of the memory cells to local lines of a selected memory block in response to the voltage control signal VCON of the control circuit 120, the local lines including the drain select line DSL, the word lines WL0~WLn and the source select line SSL. The voltage supply circuit may include a voltage generation circuit 130 and a row decoder 140.

The voltage generation circuit 130 may output the operation voltages, e.g. Verase, Vpgm, Vread, Vpass, Vvfy, Vdsl, Vssl and Vcsl needed form the program operation, the read operation or the erase operation of the memory cells to the global lines in response to the voltage control signal VCON of the control circuit 120. For example, the voltage generation circuit 130 may output a program voltage Vpgm supplied to the memory cells of a selected page and a pass voltage Vpass supplied to memory cells not selected to the global lines when the program operation is performed. The voltage generation circuit 130 may output a read voltage Vread supplied to the memory cells of the selected page and the pass voltage Vpass supplied to the memory cells not selected to the global lines when the read operation is performed. The voltage generation circuit 130 may output the erase voltage Verase supplied to the memory cells of the selected memory block to the global lines when the erase operation is performed.

The row decoder 140 may couple the global lines to local lines DSL, WL0~WLn and SSL so that the operation voltages outputted to the global lines from the voltage generation circuit 130 are supplied to the local lines DSL, WL0~WLn and SSL of the selected memory block 110MB, in response to the row address signal RADD of the control circuit 120. The program voltage Vpgm or the read voltage Vread may be supplied from the voltage generation circuit 130 to local word line, e.g. WLo coupled to the selected cell, e.g. C0e1 through the global word line. The pass voltage Vpass may be supplied from the voltage generation circuit 130 to the local word line in iterations, e.g. WL1~WLn coupled to memory cells C1e1~Cne1 not selected through the global word lines. In the erase operation, the erase voltage Verase may be supplied to every memory cell in a block. Accordingly, data may be stored in the selected cell C0e1 by the program voltage Vpgm, or data stored in the selected cell C0e1 may be read by the read voltage Vread.

Each of the page buffer groups 150 may include page buffers PB1~PBk coupled to the memory array 110 through the bit lines BLe1~BLek and BLo1~BLok. The page buffers PB1~PBk of the page buffer group 150 selectively precharge the bit lines BLe1~BLek or BLo1~BLok according to data inputted for storing data in the memory cells C0e1~C0ek or C0o1~C0ok in response to the PB control signal PBCON of the control circuit 120, or may sense voltage of the bit lines BLe1~BLek or BLo1~BLok to read data from the memory cells C0e1~C0ek or C0o1~C0ok.

For example, in the event that program data, e.g data '0' to be stored in the memory cell C0e1 is inputted to a page buffer PB1, the page buffer PB1 supplies a program allowable voltage, e.g. ground voltage to the bit line BLe1 of the memory cell C0e1 where the program data is stored when the program operation is performed. As a result, threshold voltage of the memory cell C0e1 increases by the program voltage Vpgm supplied to the word line WL0 and the program allowable voltage supplied to the bit line BLe1 in the program operation. In the event that the erase data, e.g. data '1' to be stored in the memory cell C0e1 is inputted to the page buffer PB1, the page buffer PB1 supplies a program inhibition voltage, e.g. supply voltage to the bit line BLe1 of the memory cell C0e1 where the erase data is stored when the program operation is performed. As a result, threshold voltage of the memory cell C0e1 does not increase by the program inhibition voltage supplied to the bit line BLe1 though the program voltage Vpgm is supplied to the word line WL0 in the program operation. Different data may be stored in the memory cell, accordingly, as the threshold voltage varies.

In the read operation, the page buffer group 150 may precharge every bit line, e.g. BLe1~BLek selected from the even bit lines BLe1~BLek and the odd bit lines BLo1~BLok or may discharge every bit line, e.g. BLo1~BLok not selected when the read operation is performed. In the event that the read voltage Vread is supplied to the selected word line WL0 from the voltage supply circuit 135, the bit lines of the memory cells where the program data is stored may maintain a precharge state, and the bit lines of the memory cells where the erase data is stored may be discharged. The page buffer group 150 may sense a voltage change of the bit lines BLe1~BLek, and may latch data in the memory cells corresponding to the sensing result.

Constitution of the page buffer will be described below.

The column select circuit 160 may select the page buffers PB1~PBk included in the page buffer group 150 in response to the column address signal CADD outputted from the control circuit 120. That is, the column select circuit 160 may deliver, in sequence, data to be stored in the memory cells to the page buffers PB1~PBk in response to the column address signal CADD. Additionally, the column select circuit 160 may select, in sequence, the page buffers PB1~PBk in response to the column address signal CADD so that data of the memory cells latched in the page buffers PB1~PBk may be outputted to an external device by the read operation.

The input/output circuit 170 may deliver data to the column select circuit 160 according to control of the control circuit 120, to deliver data inputted from an external device to the page buffer group 150. The data may be stored in the memory cells in the program operation. In the event that the column select circuit 160 delivers the data inputted from the input/output circuit 170 to the page buffers PB1~PBk of the page buffer group 150 as mentioned above, the page buffers PB1~PBk store the inputted data in an internal latch circuit. The input/output circuit 170 may output data delivered from the page buffers PB1~PBk of the page buffer group 150 through the column select circuit 160 to an external device when the read operation is performed.

The pass/fail check circuit 180 may output a pass/fail signal PFS in response to comparison result signals outputted from the page buffers PB1~PBk in a program verify operation performed after the program operation. Particularly, threshold voltage of the memory cell may be compared with a target voltage in the program verify operation, and the comparing result may be latched in the latch circuit of the page buffers PB1~PBk. The comparison result signals corresponding to the latched comparing result may be outputted to the pass/fail check circuit 180. The pass/fail check circuit 180 may output the pass/fail signal PFS showing whether the program operation is completed to the control circuit 120 in response to the comparison result signals. The control circuit 120 may detect whether a memory cell, having threshold voltage lower than the target voltage, of the memory cells where the program data is stored, exists in response to the pass/fail signal PFS, and may determine whether the program operation is again performed according to the detecting result.

Especially, the control circuit 120 may control to precharge more rapidly the bit line coupled to the program inhibition cells accordingly as the program operation is iteratively performed, for example, the iteration number of the program voltage increases (or the number of the program inhibition cells augments). This will be described below.

Figure 3:
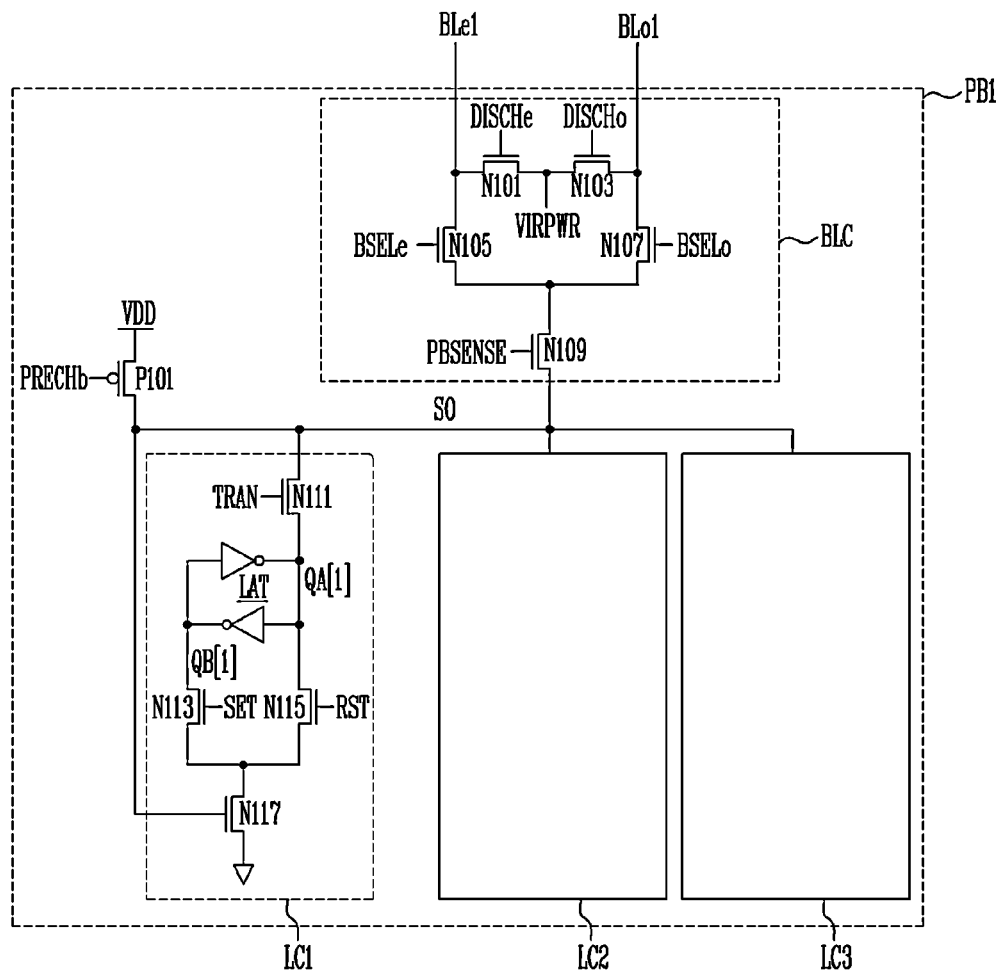
FIG. 3 is a view illustrating circuit diagram of a page buffer in FIG. 1.

FIG. 3 is a view illustrating a circuit diagram of a page buffer in FIG. 1.

In FIG. 3, the page buffer PB1 operates in response to control of the control circuit (120 in FIG. 1). The following signals: PRECHb, TRAN, RST, SET, PBSENSE, BSELe, BSELo, DISCHe and DISCHo may be outputted from the control circuit.

The page buffer PB1 may include a bit line couple circuit BLC, a precharge circuit P101 and latch circuits LC1~LC3.

Switching elements N105 and N107 of the bit line couple circuit BLC select one of an even bit line BLe1 and an odd bit line BLo1 in response to bit line select signals BSELe and BSELo, and switching elements N101 and N103 may precharge a bit line not selected in the program operation or may discharge a bit line not selected in the read operation in response to discharge signals DISCHe and DISCHo. A switching element N109 may couple the bit line selected by the switching elements N105 and N107 to one of the latch circuits LC1~LC3 in response to a couple signal PBSENSE. The latch circuits LC1~LC3 may be coupled in parallel to the switching element N109, and a coupling node of the switching element N109 and the latch circuits LC1~LC3 is sensing node SO.

The precharge circuit P101 may precharge the sensing node SO in response to a precharge signal PRECHb.

The number of latch circuits LC1~LC3 may be changed according to the desired design. The number of the latch circuits LC1~LC3 is assumed to be 3 for convenience of description. Only one of the latch circuits LC1~LC3 is generally activated. A first latch circuit LC1 may store, temporarily, data inputted from the column select circuit 160 and deliver the data to a second latch circuit LC2, or store, temporarily, data read from the memory cell by the read operation and output the read data to the column select circuit 160 (see FIG. 1). The second latch circuit LC2 may supply a program inhibition voltage or a program allowable voltage to the bit line in the program operation according to the data delivered from the first latch circuit LC1. The second latch circuit LC2 may store, temporarily, the data stored in the memory cell in response to a voltage of the bit line in the read operation and deliver the stored data to the first latch circuit LC1. The third latch circuit LC3 may latch the comparing result of the threshold voltage of the memory cell and the target voltage in the verify operation performed after the program operation, and may output the comparison result signal corresponding to the comparing result to the pass/fail check circuit (180 in FIG. 1).

The latch circuits may include switching elements and a latch. Operation of the latch circuits will be described through the first latch circuit LC1.

The first latch circuit LC1 may include a latch LAT for latching data, a switching element N111 for coupling a first node QA[1] of the latch LAT to the sensing node SO in response to a transmission signal TRAN, switching elements N113 and N115 coupled to the first node QA[1] (non-inverting terminal) and a second node QB[1] (inverting terminal) of the latch LAT and operating in response to a set signal SET and a reset signal RST, and a switching element N117 coupled between the switching elements N113 and N115 and a ground terminal and operating according to potential of the sensing node SO. FIG. 3 also illustrates voltage supply VDD.

Since signals having different waveforms may be inputted to different latch circuits LC2 and LC3, only one latch circuit may be activated or the latch circuits may perform different functions though the latch circuits have the same constitution.

Figure 4:
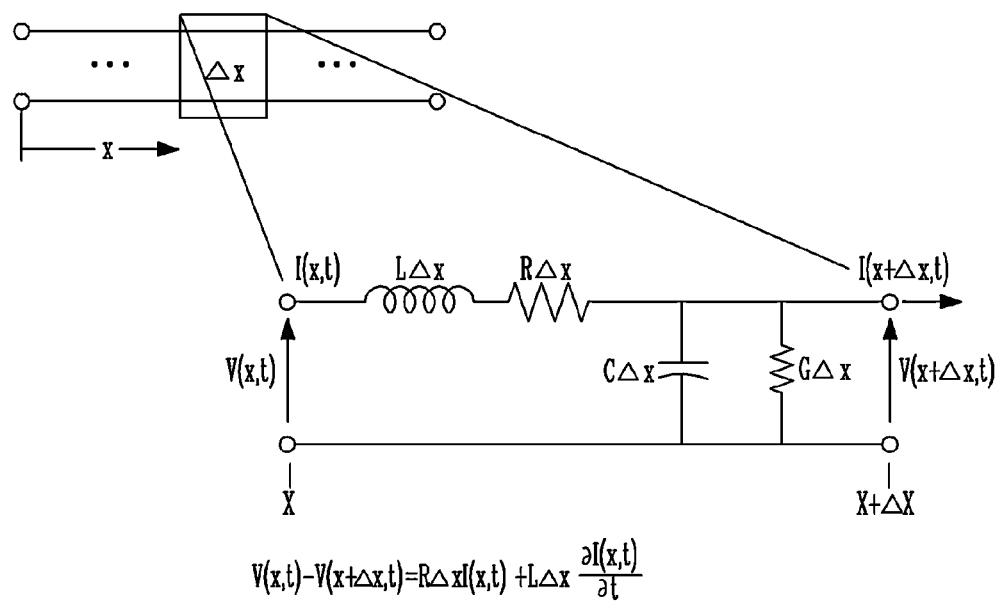
FIG. 4 is a view illustrating bit line precharge time in accordance with increase of loading of the bit line.

FIG. 4 is a view illustrating bit line precharge time in accordance with increase of loading of the bit line.

Loading of the bit line rises as the integration of the memory chip increases. The number of cells that are program inhibited increases in accordance with the increase in the program iteration number in the program operation. Accordingly, the bit lines should be precharged rapidly. Here in this embodiment, the cells that are program inhibited include memory cells of which programming is initially inhibited and also any cells whose threshold voltage has increased to a voltage greater than the target voltage during the program operation.

In FIG. 4, relation between the increase in the loading of the bit line and voltage change may be expressed as a distributed element model. The inductance component does not exist because it does not include a frequency component. Accordingly, the relation may be realized with a 2 port network as shown in FIG. 4. Since resistance of the bit line augments in the event that the loading of the bit line increases, a time taken for precharging the bit line (bit line precharge time) increases. Hence, resistance of the bit line should be reduced. The semiconductor memory device in the present embodiments divides the loading of the bit line and then precharges the bit line, thereby dividing resistance of the bit line. Accordingly, the semiconductor memory device may reduce a bit line precharge time.

Figure 5:
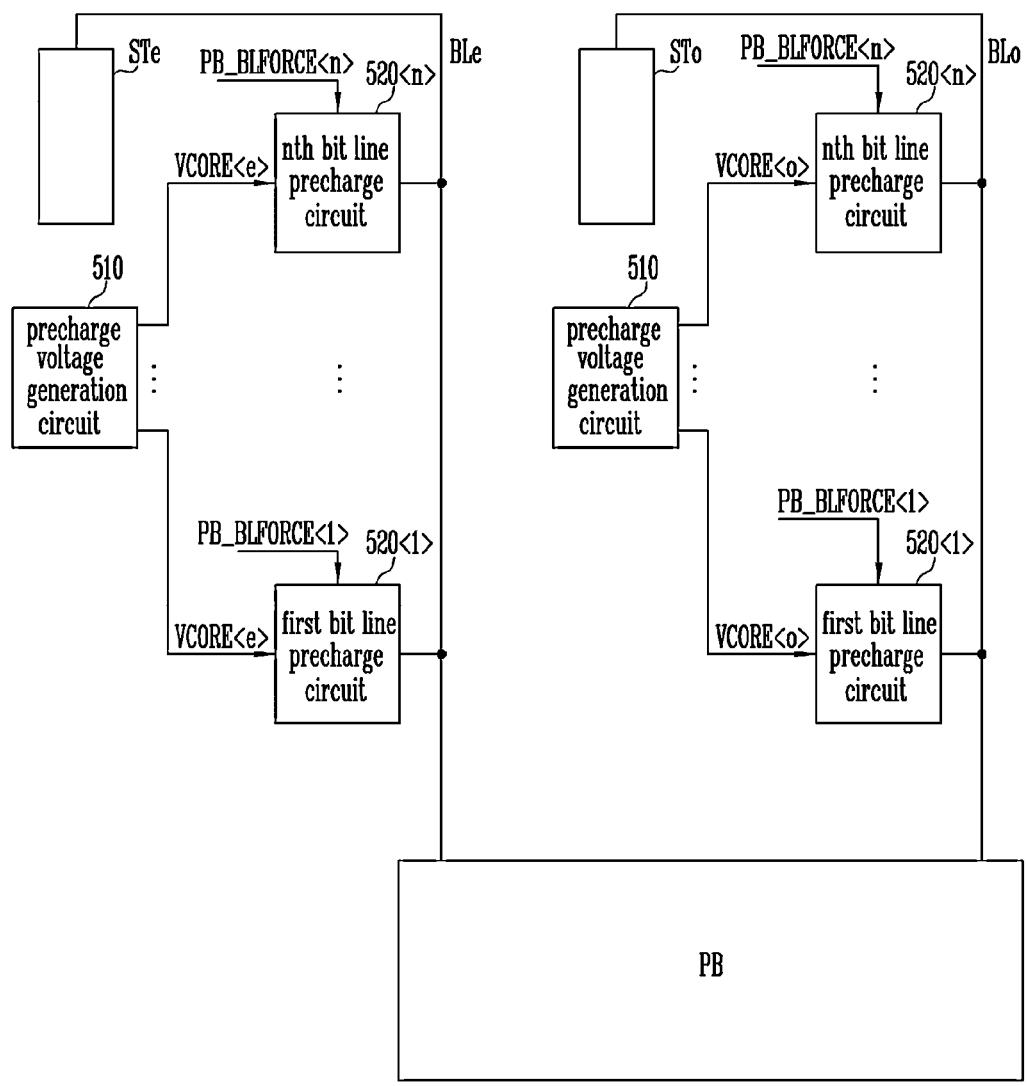
FIG. 5 is a block diagram illustrating peripheral circuit of the bit line in FIG. 1.

FIG. 5 is a block diagram illustrating peripheral circuit of the bit line in FIG. 1.

In FIG. 5, a semiconductor memory device may include cell strings STe and STo, a page buffer PB, a precharge voltage generation circuit 510 and a first to an nth bit line precharge circuits 520<1>~520<n>. The control circuit 120 in FIG. 1 controls the first to the nth bit line precharge circuits 520<1>~520<n>.

The cell strings may be divided into an even cell string STe and an odd cell string STo. The even cell string STe is coupled to an even bit line BLe, and the odd cell string STo is coupled to an odd bit line BLo. A program operation is not performed about memory cells coupled to the odd bit line BLo when a program operation is performed about memory cells coupled to the even bit line BLe. That is, the odd bit line BLo becomes a bit line not selected in the event that a bit line selected for the program operation is the even bit line BLe.

The precharge voltage generation circuit 510 may generate a precharge voltage VCORE(e/o) from an external voltage according to data stored in a latch section (not shown) of the page buffer PB. The precharge voltage generation circuit 510 will be described with reference to accompanying drawing FIG. 7.

The first to the nth bit line precharge circuits 520<1>~520<n> may deliver the precharge voltage VCORE (e/o) to the bit line in response to a first to an nth precharge control signals PB_BLFORCE<1>~PB_BLFORCE<n>. The first bit line precharge circuit 520<1> may deliver the precharge voltage VCORE(e/o) to the bit line in response to the first precharge control signal PB_BLFORCE<1>. A second bit line precharge circuit 520<2>, for example, may deliver the precharge voltage VCORE(e/o) to the bit line in response to a second precharge control signal PB_BLFORCE<2> (not shown). The nth bit line precharge circuit 520<n> may deliver the precharge voltage VCORE(e/o) to the bit line in response to the nth precharge control signal PB_BLFORCE<n>.

The first to the nth bit line precharge circuits 520<1>~520<n> may be coupled to the bit line with each spaced from each other by, for example, a constant distance. That is, the bit line may be divided into (n+1) parts by the first to the nth bit line precharge circuits 520<1>~520<n>.

The control circuit 120 (see FIG. 1) may output the precharge control signals so that the number of enabled bit line precharge circuits increases as the program iteration number increases in a program operation in which a program voltage is iteratively applied or supplied. That is, the greater the program iteration number, the greater the number of bit line precharge circuits that are enabled. The bit line is precharged by the bit line precharge circuits.

Figure 6:
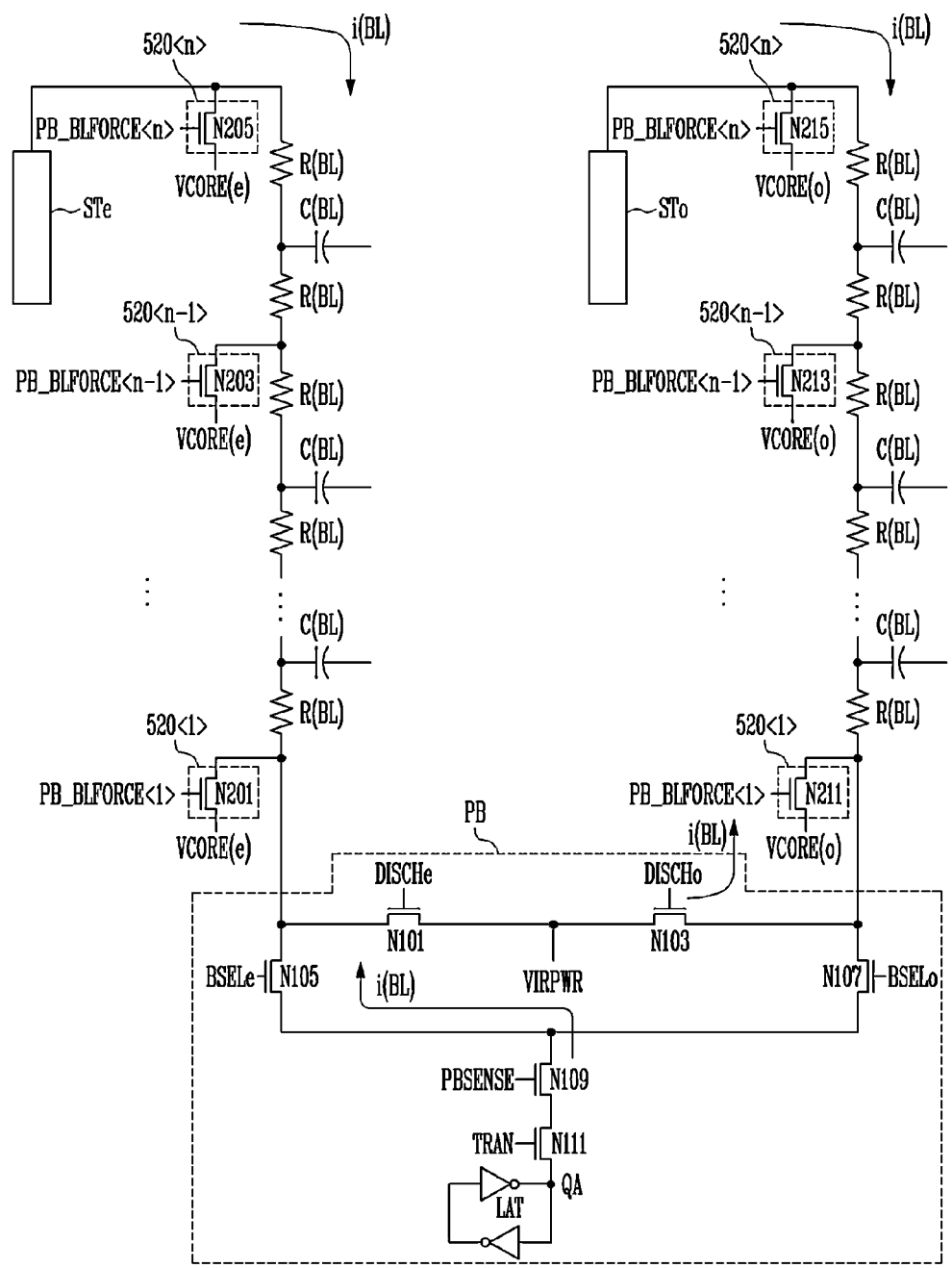
FIG. 6 is a view illustrating detailed circuit diagram of the peripheral circuit of the bit line in FIG. 5.

FIG. 6 is a view illustrating a detailed circuit diagram of the peripheral circuit of the bit line in FIG. 5. As mentioned in FIG. 4, capacitance C(BL) and resistance R(BL) of the bit line may be shown in view of loading of the bit line not frequency. Also, illustrated in FIG. 6 is the current i(BL) of the bit line.

In FIG. 6, the bit line precharge circuits 520<1>~520<n> may include switching elements.

The first bit line precharge circuit 520<1> may include a switching element N201 for delivering the precharge voltage VCORE(e) to the bit line in response to the first precharge control signal PB_BLFORCE<1>. A (n−1)th bit line precharge circuit 520<n−1> may include a switching element N203 for delivering the precharge voltage VCORE(e) to the bit line in response to the (n−1)th precharge control signal PB_BLFORCE<n−1>. The nth bit line precharge circuit 520<n> may include a switching element N205 for delivering the precharge voltage VCORE(e) to the bit line in response to the nth precharge control signal PB_BLFORCE<n>.

Since the page buffer PB may be substantially identical to the page buffer in FIG. 3, any further description concerning the page buffer PB will be omitted.

In the event that the program operation is performed about memory cells coupled to the even bit line, the even bit line is a selected bit line, and the odd bit line is a bit line not selected. The bit line should maintain the precharge state in the program operation so that the threshold voltage of the memory cell does not increase by the program operation. The even bit line is precharged according to the data stored temporarily in the latch LAT of the page buffer PB. The odd bit line is precharged by using a virtual power VIRPWR (see FIG. 3 as well) in response to an odd discharge signal DISCHo. In the event that the data stored in the latch LAT is program inhibition data (i.e., data '1'), the bit line maintains precharge state in response to signals TRAN, PBSENSE and BSELe.

Here, the control circuit 120 may output the bit line precharge signal PB_BLFORCE. Accordingly, the bit line may be further precharged by the bit line precharge circuits 520, and thus the bit line may be rapidly precharged. That is, the bit line precharge circuits 520 increases a driving power for precharging the bit line. The driving power is a summation of the contribution by program inhibition data stored in the latch LAT and the contribution by the bit line precharge circuits 520 enabled by the precharge control signal PB_BLFORCE. Accordingly, the more the bit line precharge circuits 520 are enabled, the more the driving power for precharging the bit line increases. As described above, the number of the program inhibition cells increases accordingly as the program operation is iteratively performed. The number of the bit line precharge circuits 520 enabled by the precharge control signal PB_BLFORCE increases accordingly as the number of the program inhibition cells augment, and so the bit line may be more rapidly precharged.

In an embodiment, the control circuit 120 may output the precharge control signals PB_BLFORCE so that the bit line precharge circuits 520 coupled to the even bit lines may be enabled in the event that the program operation is performed about the memory cells coupled to the even bit line.

In an embodiment, the control circuit 120 may output the precharge control signals PB_BLFORCE so that every precharge circuit 520 coupled to the even bit line and the odd bit line is enabled. In this case, the precharge voltage VCORE(e)

may be delivered to only the even bit line, so as to prevent the odd bit line from being further precharged by the bit line precharge circuits 520.

Figure 7:
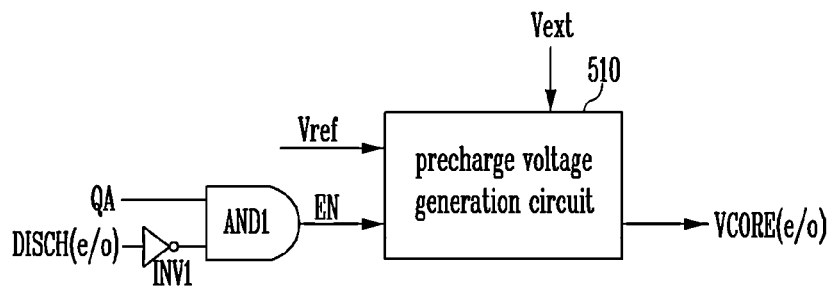
FIG. 7 is a block diagram illustrating a bit line voltage generation circuit in FIG. 5.

FIG. 7 is a block diagram illustrating a bit line voltage generation circuit in FIG. 5.

In FIG. 7, the precharge voltage generation circuit 510 may output the precharge voltage VCORE(e/o) from an external voltage Vext in response to an enable signal EN. The precharge voltage generation circuit 510 may compare a voltage divided from the external voltage Vext with a reference voltage Vref, and may output the precharge voltage VCORE(e/o) according to the comparison result. The precharge voltage generation circuit 510 may include a comparator, etc. for feedback control.

The enable signal EN may be outputted in response to the data stored in the latch, i.e. voltage level of the node QA of the latch and the discharge signal DISCH(e/o). In the event that the data stored in the latch is at a high level, i.e. data '1' and the discharge signal DISCH(e/o) has a low level, the discharge signal DISCH(e/o) inverted by an inverter INV1 and the data may be inputted to a logical element AND1, and the logical element AND1 may output the enable signal EN with a high level.

In the event that the even bit line is selected and the odd bit line is not selected, an even discharge signal DISCHe has a low level and an odd discharge signal DISCHo has a high level. As a result, the precharge voltage generation circuit 510 does not operate, and thus a precharge voltage VCORE(o) is not outputted to the bit line precharge circuit 520 coupled to the odd bit line. The odd bit line is not precharged further by the bit line precharge circuits 520. In the event that the data stored in the latch is not the program inhibition data, i.e. data '1', the precharge voltage generation circuit 510 also does not operate. As a result, the bit line corresponding to the program inhibition cell of selected bit lines is further precharged by the bit line precharge circuits 520 (see FIG. 5).

Figure 8:
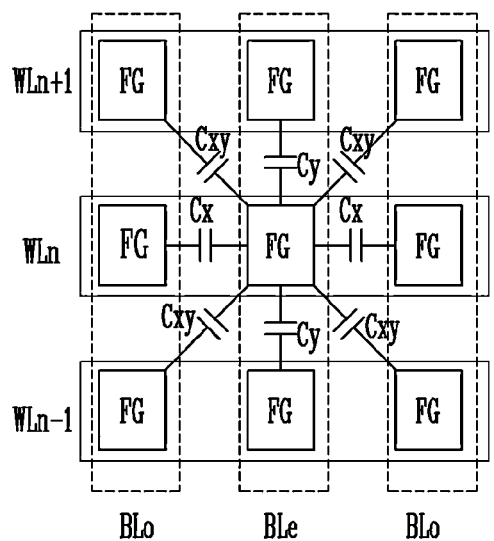
FIG. 8 is a view illustrating conceptually capacitance coupling phenomenon between adjoining bit lines in a program operation.
Figure 9:
FIG. 9 is a view illustrating a graph showing correlation of the supply number of a program voltage in the program operation and the number of program inhibition cells.
Figure 10:
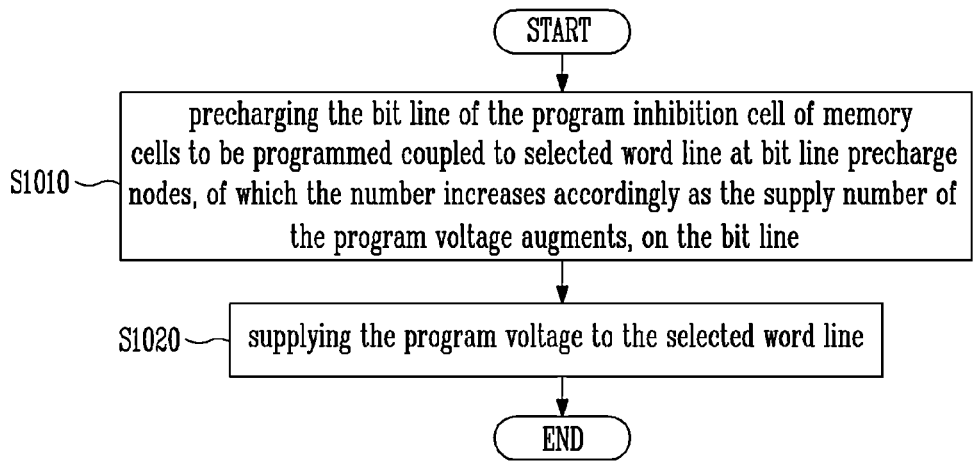
FIG. 10 is a flowchart illustrating a method of operating a semiconductor memory device according to an embodiment of the present invention.

FIG. 8 is a view illustrating, conceptually, the capacitance coupling phenomenon between adjoining bit line in a program operation. FIG. 9 is a view illustrating a graph showing the correlation of the program iteration number in the program operation and the number of cells that are program inhibited. FIG. 10 is a flowchart illustrating a method of operating a semiconductor memory device according to an embodiment of the present invention.

In FIG. 8, coupling capacitance Cx in the direction of a word line (i.e., WLn+1, WLn−1, WLn), coupling capacitance Cy in the direction of a bit line (i.e., BLo, BLe) and coupling capacitance Cxy in the diagonal direction may be generated between adjoining memory cells. In view of a memory cell (i.e., FG) located at a center of nine memory cells coupled to an nth word line WLn and an even bit line BLe, two coupling capacitance Cx in the direction of the word line, two coupling capacitance Cy in the direction of the bit line and four coupling capacitance Cxy in the diagonal direction are generated between the memory cell and adjacent memory cell. The coupling capacitance between the memory cells gets higher, accordingly, as distance between the memory cells becomes smaller due to an increase in the integrity of the memory chip.

The coupling capacitance phenomenon means a phenomenon that voltage of the word line or the bit line of the memory cell is changed due to the coupling capacitance between adjoining memory cells.

In FIG. 9, the threshold voltage of the memory cells increases in the event that supply number of the program voltage augments due to iteration of the program operation, and thus the number of the program inhibition cells increases.

The number of the program inhibition cells is small at initial stage of the program operation. Here, in the event that the bit line is excessively precharged by using the bit line precharge circuits, current consumption may increase and peak current may occur due to the capacitance coupling phenomenon.

Referring to FIG. 10, in step S1010, the method of operating the semiconductor memory device of the various embodiments, may precharge the bit line of the program inhibition cell of memory cells to be programmed coupled to a selected word line at bit line precharge nodes, of which the number increases accordingly as the supply number of the program voltage augments, on the bit line. In step S1020, the program voltage is supplied to the selected word line.

That is, in the event that the number of the bit line precharge circuits enabled at the initial stage of the program operation is small and the number of the program inhibition cells increases due to the iteration of the program operation, the number of the enabled bit line precharge circuits increases.

Figure 11:
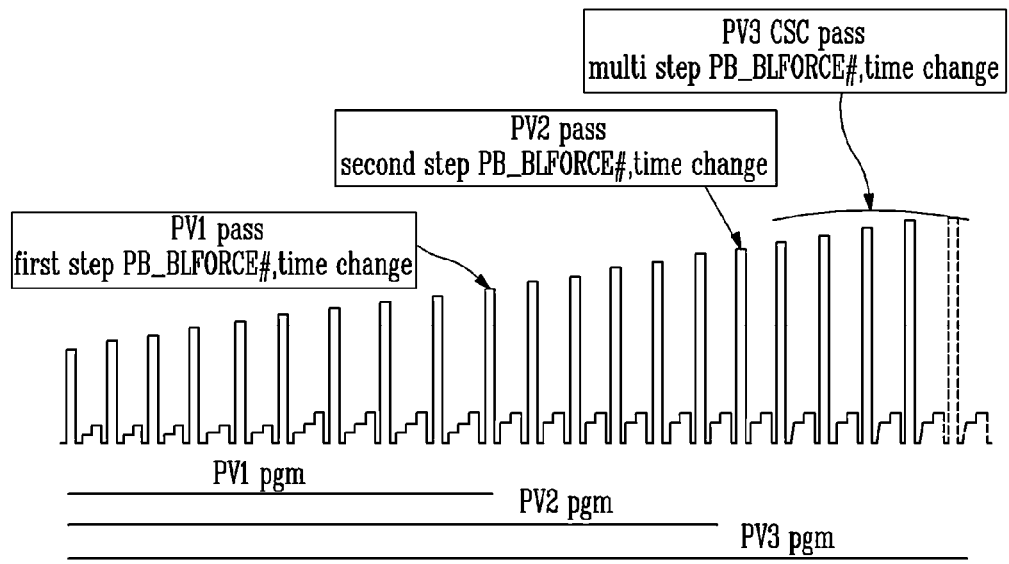
FIG. 11 to FIG. 13 are views illustrating operation of a semiconductor memory device when 2 bit MLC program operation is performed according to an embodiment of the present invention.
Figure 12:
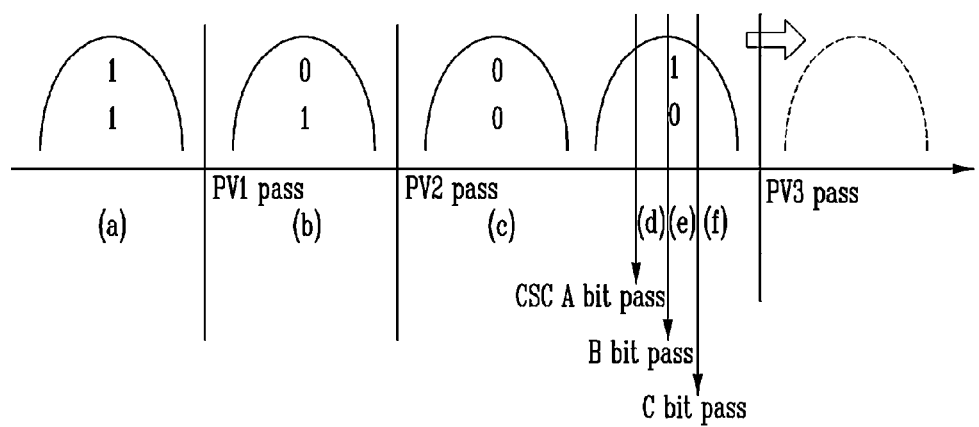
Figure 13:
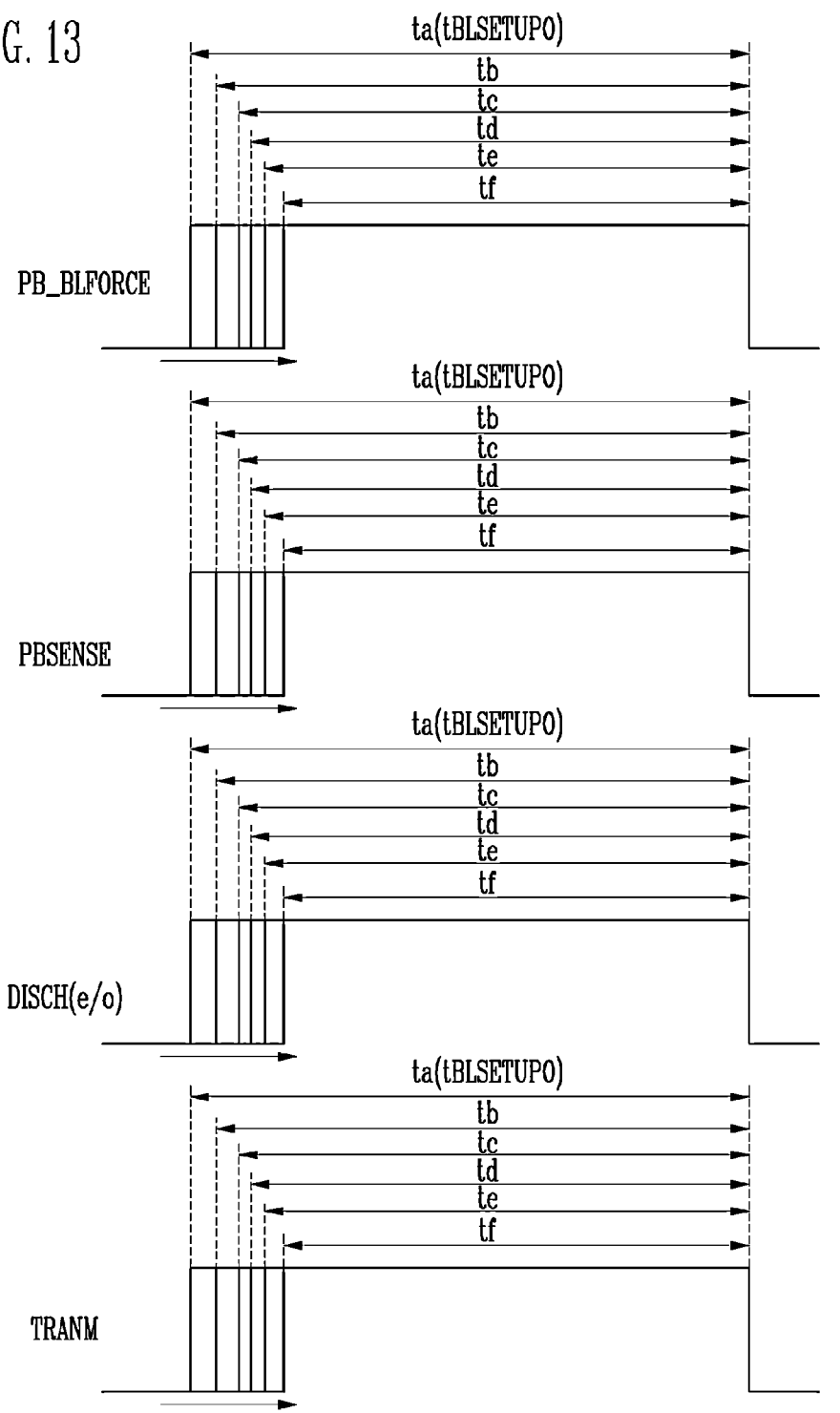

FIG. 11 to FIG. 13 are views illustrating operation of a semiconductor memory device when a 2 bit multi level cell MLC program operation is performed according to the various embodiments.

FIG. 11 to FIG. 13 show operation of the semiconductor memory device when a 2 bit multi level cell MLC program operation is performed as an example of an operation of the various embodiments. However, the operation of the present embodiments are not limited to the 2 bit MLC program operation, and may be applied to another bit MLC program operation.

The 2 bit MLC program operation performs a program verify operation on the basis of first to third verify voltages PV1~PV3. Four different threshold voltage distributions may be generated in the event that the 2 bit MLC program operation is performed.

In FIG. 11 and FIG. 12, the method of operating the semiconductor memory device of the present embodiments may precharge further the bit line with increasing the number of the bit line precharge circuits enabled until a first verify operation is passed, i.e. PV1 pass in the unit of a first step, e.g. m.

The method precharges further the bit line with increasing the number of the bit line precharge circuits enabled until a second verify operation is passed, i.e. PV2 pass after the first verify operation is passed in the unit of a second step, e.g. n, n being higher than m.

The method performs the program operation by supplying the program voltage (i.e., pgm) after a third verify operation is performed, verifies how many bits are passed whenever the third verify operation is performed, and increases dynamically the number of the enabled bit line precharge circuits according to the verifying result. A CSC check (i.e., complete state coding) method may be used to verify how many bits are passed whenever the third verify operation is performed.

No bit line precharge circuit is enabled when first program voltage is supplied, and n bit line precharge circuits are enabled when final program voltage is supplied.

Accordingly, the method may prevent a phenomenon that current consumption increases and peak current occurs at the initial stage of the program operation, the number of the program inhibition cells being small at the initial stage.

In FIG. 12 and FIG. 13, a method of operating the semiconductor memory device of the present embodiments may output precharge control signals having short activation intervals, i.e. short high level intervals accordingly as the number of the enabled bit line precharge circuits increases. Accordingly, operation time reduces, and so operation performance may be enhanced.

At an initial state, the method outputs the precharge control signals for a first time ta(tBLSETUP0). The first time tBLSETUP0 means a minimum time needed for preventing occurrence of the peak current.

In the event that the first verify operation is passed (i.e., PV1 pass) as shown in (b) of FIG. 12, the method outputs the precharge control signals for a second time are tb shorter than the first time ta.

In the event that the second verify operation is passed as shown in (c) (i.e., PV2 pass) of FIG. 12, the method outputs the precharge control signals for a third time are tc shorter than the second time tb.

The method verifies how many bits (i.e., 11, 01, 00, 10) are passed whenever the third verify operation is again performed after the third verify operation is performed, and reduces dynamically a time for which the precharge control signals are outputted according to the verifying result. Particularly, the method outputs the precharge control signals for a fourth time td in the event that A bit is passed by performing a first CSC check operation as shown in (d) of FIG. 12, the fourth time td being shorter than the third time tc. The method outputs the precharge control signals for a fifth time te in the event that B bit has passed by performing a second CSC check operation as shown in (e) of FIG. 12, the fifth time te being shorter than the fourth time td. The method outputs the precharge control signals for a sixth time tf in the event that C bit has passed by performing a third CSC check operation as shown in (f) of FIG. 12, the sixth time tf being shorter than the fifth time te.

Accordingly, the method of operating the semiconductor memory device of the present invention may reduce operation time with preventing occurrence of the peak current.

In an embodiment, activation interval of signals PBSENSE, DISCH(e/o) and TRANM included in the page buffer control signals (PBCON in FIG. 1) get shorter accordingly as the program operation is iteratively performed, like the precharge control signals BLFORCE for controlling the bit line precharge circuits.

Figure 14:
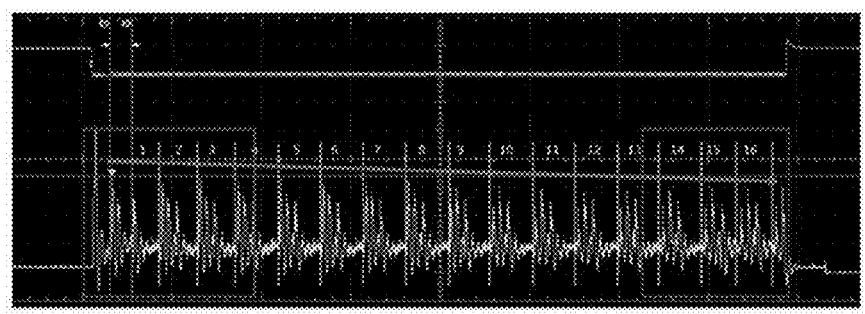
FIG. 14 is a view illustrating simulation result when method in FIG. 11 to FIG. 13 is performed.

FIG. 14 is a view illustrating a simulation result when method in FIG. 11 to FIG. 13 is performed.

As shown in FIG. 14, current reduces more and more according as the program operation when iteratively performed, in the event that the method in FIG. 11 to FIG. 13 is not used. That is, maximum peak current occurs at the initial stage of the program operation where the number of the program inhibition cells is small, and intensity of the peak current reduces according to the number of the program inhibition cells increases more and more.

In the event that the method in FIG. 11 to FIG. 13 is used, the method operates a small number of the bit line precharge circuits enabled until the first verify operation is passed, i.e. PV1 pass and makes longer maximum a time for which the precharge control signal is activated, thereby preventing occurrence of the peak current.

The method increases the number of the bit line precharge circuits enabled until the second verify operation is passed, i.e. PV2 pass after the first verify operation is passed and reduces a time for which the precharge control signal is activated, thereby enhancing operation performance with preventing occurrence of the peak current.

The method performs the third verify operation, then verifies how many bit is passed whenever the third verify operation is again performed after the program operation is performed, and increases dynamically the number of the enabled bit line precharge circuit and reduces a time for which the precharge control signals are outputted according to the verifying result. Accordingly, the method may enhance operation performance and reduce operation current whenever the third verify operation is performed.

Figure 15:
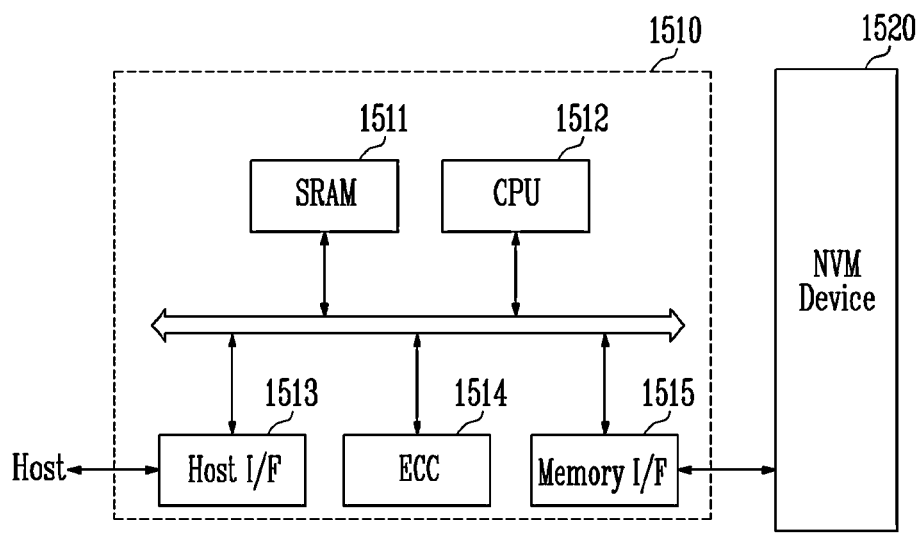
FIG. 15 is a block diagram illustrating schematically a memory system according to an embodiment of the present invention.

FIG. 15 is a block diagram illustrating schematically a memory system according to an embodiment.

In FIG. 15, the memory system 1500 of the present embodiments may include a non-volatile memory device 1520 and a memory controller 1510.

The non-volatile memory device 1520 may be the semiconductor memory device described above. The memory controller 1510 controls the non-volatile memory device 1520. The memory system 1500 may be used as a memory card or a solid state disk SSD by combination of the non-volatile memory device 1520 and the memory controller 1510. An SRAM 1511 is used as an operation memory of a processing unit 1512. A host interface 1513 has a data exchange protocol of a host accessed to the memory system 1500. An error correction block 1514 detects and corrects error of data read from the non-volatile memory device 1520. A memory interface 1514 interfaces with the non-volatile memory device 1520 of the present invention. The processing unit 1512 performs control operation for data exchange of the memory controller 1510.

The memory system 1500 of the present embodiments may further include a ROM (not shown) for storing code data for interfacing with the host and so on. The non-volatile memory device 1520 may be provided as multi-chip package including flash memory chips. The memory system 1500 of the present invention may be provided as high-reliable storage medium having low error possibility. Specially, the flash memory device of the present invention may be included in the SSD studied actively in recent. In this case, the memory controller 1510 communicates with an outside device, e.g. host through one of various interface protocols such as USB, MMC, PCI-E, SATA, PATA, SCSI, ESDI, IDE, etc.

Figure 16:
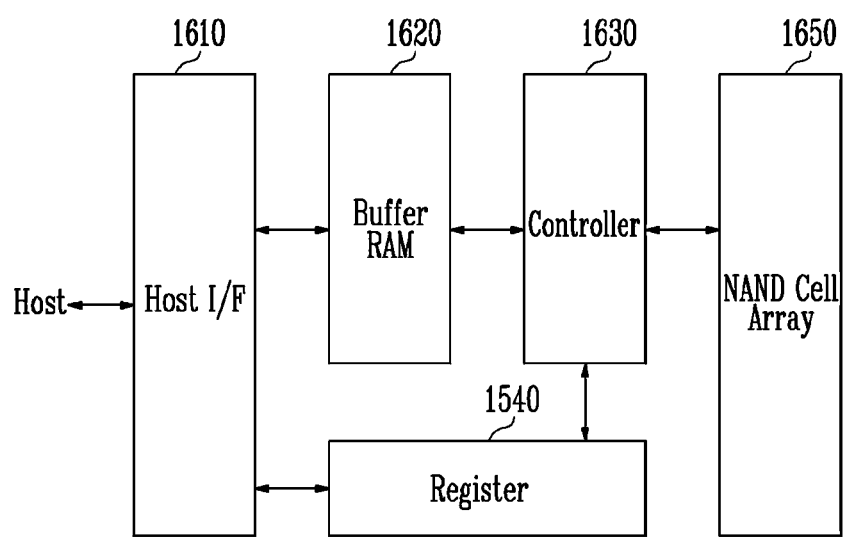
FIG. 16 is a block diagram illustrating schematically a fusion memory device or a fusion memory system for performing a program operation according to the embodiments described above.

FIG. 16 is a block diagram illustrating schematically a fusion memory device or a fusion memory system for performing a program operation according to the embodiments described above. For example, features of the present embodiments may be applied to an OneNAND flash memory device 1600 as a fusion memory device.

The OneNAND flash memory device 1600 may include a host interface 1610 for exchanging information with a device using a different protocol, a buffer RAM 1620 for embedding code for driving the memory device or storing temporarily data, a controller 1630 for controlling reading, programming and every state in response to a control signal and a command inputted from an outside device, a register 1540 for storing data such as configuration for defining command, address, system operation environment in the memory device, and a NAND flash cell array 1650 (i.e., NAND Cell Array) having operation circuit including a non-volatile memory cell and a page buffer. The OneNAND flash memory device programs data through the above described method in response to write request from the host.

Figure 17:
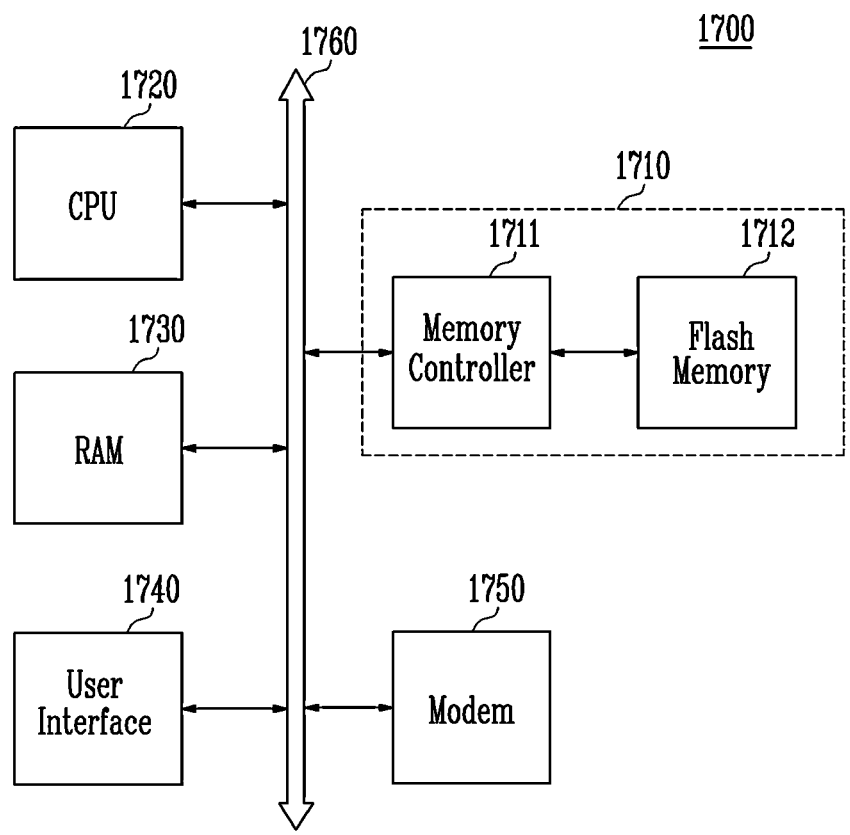
FIG. 17 is a view illustrating schematically a computing system including a flash memory device according to the embodiments of the present invention.

FIG. 17 is a view illustrating schematically a computing system including a flash memory device according to the embodiments.

The computing system 1700 of the present embodiments may include a microprocessor or central processing unit CPU 1720 connected electrically to a system bus 1760, a RAM 1730, an user interface 1740, a modem 1750 such as a baseband chipset, and a memory system 1710. In case that the computing system 1700 is a mobile device, a battery (not shown) for supplying an operation voltage of the computing system 1700 may be further provided. The computing system 1700 of the present invention may further include an application chipset, a camera image processor CIS, a mobile DRAM, etc., which are shown. The memory system 1710 may include an SSD using for example a non-volatile memory for storing data. The memory system 1710 may be applied to a fusion flash memory, e.g. OneNAND flash memory.

The various embodiments may be realized through a program or a recording medium, where the program is written, as well as the device and the method.

Although various embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A semiconductor memory device comprising:
    a cell string configured to include memory cells;
    a page buffer coupled to the cell string through a bit line, and configured to include a latch for storing data to be programmed in a memory cell or data read from the memory cell;
    a precharge voltage generation circuit configured to generate a precharge voltage from an external voltage according to the data stored in the latch;
    bit line precharge circuits configured to supply the precharge voltage to the bit line in response to precharge control signals; and
    a control circuit configured to output the precharge control signals so that the number of enabled bit line precharge circuits increases in accordance with the increase in a program iteration number in a program operation, wherein a program voltage is applied to a word line iteratively.

2. The semiconductor memory device of claim 1, wherein the control circuit outputs the precharge control signals so that the number of the enabled bit line precharge circuits increases accordingly as the number of program inhibition cells of memory cells for the program operation augments.

3. The semiconductor memory device of claim 1, wherein the precharge voltage generation circuit supplies the precharge voltage to the bit line precharge circuits coupled to a bit line selected for the program operation of bit lines.

4. The semiconductor memory device of claim 1, wherein when verify operations are performed on the basis of different verify voltages in the program operation, the control circuit outputs the precharge control signals to increase the number of the enabled bit line precharge circuits whenever the verify operation is passed.

5. The semiconductor memory device of claim 4, wherein in a 2 bit multi level cell (MLC) program operation where the verify operation is performed on the basis of first to third verify voltages, the control circuit:
    outputs the precharge control signals, the number of the precharge control signals increasing in a unit of m until a first verify operation based on the first verify voltage is passed,
    outputs the precharge control signals, the number of the precharge control signals increasing in a unit of n greater than m until a second verify operation based on a second verify voltage is passed after the first verify operation is passed, and
    outputs the precharge control signals, the number of the precharge control signals increasing according to the number of bits passed whenever a third verify operation is performed after the third verify operation based on the third verify voltage is performed;
    wherein, m is an integer greater than 1 and n is an integer greater than m.

6. The semiconductor memory device of claim 4, wherein the control circuit outputs the precharge control signals of which an activation interval shortens accordingly, as the number of the enabled bit line precharge circuits increases.

7. The semiconductor memory device of claim 6, wherein in a 2 bit MLC program operation where the verify operation is performed on the basis of first to third verify voltages, the control circuit:
    outputs the precharge control signals for a first time until a first verify operation based on the first verify voltage is passed,
    outputs the precharge control signals for a second time until a second verify operation based on a second verify voltage is passed after the first verify operation is passed, the second time being shorter than the first time, and
    outputs the precharge control signals for a time, which reduces according to the number of bits passed whenever a third verify operation is performed after the third verify operation based on the third verify voltage is performed.

8. A semiconductor memory device comprising:
    cell strings configured to include memory cells;
    page buffers coupled to the cell string through a bit line, and configured to include a latch for storing data to be programmed in a memory cell or data read from the memory cell;
    bit line precharge circuits configured to supply a precharge voltage to the bit line in response to precharge control signals, in the event that the data stored in the latch is first data; and
    a control circuit configured to output the precharge control signals so that the number of enabled bit line precharge circuits increases in accordance with the increase in a program iteration number in a program operation, wherein a program voltage is applied to a word line iteratively.

9. The semiconductor memory device of claim 8, wherein the control circuit outputs the precharge control signals so that the number of the enabled bit line precharge signals increases, as the number of page buffers that store the first data increases.

10. The semiconductor memory device of claim 8, wherein when verify operations are performed on the basis of different verify voltages in the program operation, the control circuit outputs the precharge control signals to increase the number of the enabled bit line precharge circuits whenever the verify operation is passed.

11. The semiconductor memory device of claim 10, wherein in a 2 bit MLC program operation where the verify operation is performed on the basis of first to third verify voltages, the control circuit:
    outputs the precharge control signals, the number of the precharge control signals increasing in a unit of m until a first verify operation based on the first verify voltage is passed,
    outputs the precharge control signals, the number of the precharge control signals increasing in a unit of n greater than m until a second verify operation based on a second verify voltage is passed after the first verify operation is passed, and
    outputs the precharge control signals, the number of the precharge control signals increasing according to the number of a bit passed whenever a third verify operation is performed after the third verify operation based on the third verify voltage is performed;

wherein, m is an integer greater than 1 and n is an integer greater than m.

12. The semiconductor memory device of claim 10, wherein the control circuit outputs the precharge control signals of which an activation interval shortens accordingly, as the number of the enabled bit line precharge circuits increases.

13. The semiconductor memory device of claim 12, wherein in a 2 bit MLC program operation where the verify operation is performed on the basis of a first to a third verify voltages, the control circuit:

outputs the precharge control signals for a first time until a first verify operation based on the first verify voltage is passed, outputs the precharge control signals for a second time until a second verify operation based on a second verify voltage is passed after the first verify operation is passed, the second time being shorter than the first time, and outputs the precharge control signals for a time, which reduces according to the number of bits passed whenever a third verify operation is performed after the third verify operation based on the third verify voltage is performed.

14. A method of operating a semiconductor memory device, the method comprising:

precharging a bit line of program inhibition cells of memory cells to be programmed coupled to a selected word line at bit line precharge nodes on the bit line; and supplying a program voltage to the selected word line, wherein the bit line is precharged at the bit line precharge nodes and the number of bit line precharge nodes increases as the program iteration number increases in a program operation, wherein the program voltage is supplied to the selected word line iteratively.

15. The method of claim 14, wherein the bit line precharge nodes are disposed with each spaced from each other by a substantially constant distance.

16. The method of claim 14, wherein the bit line is precharged at the bit line precharge nodes of which the number increases accordingly as the number of the program inhibition cells augments.

17. The method of claim 14, wherein the bit line is precharged at the bit line precharge nodes of which the number increases whenever a verify operation is passed, in the event that the verify operation is performed on the basis of different verify voltages in a program operation.

18. The method of claim 17, wherein in a 2 bit MLC program operation where the verify operation is performed on the basis of first to third verify voltages, the bit line is precharged:

at the bit line precharge nodes of which the number increases in the unit of m until a first verify operation based on the first verify voltage is passed, at the bit line precharge nodes of which the number increases in a unit of n greater than m until a second verify operation based on a second verify voltage is passed after the first verify operation is passed, and at the bit line precharge nodes of which the number increases according to the number of bits passed whenever a third verify operation is performed after the third verify operation based on the third verify voltage is performed, wherein, m is an integer greater than 1 and n is an integer greater than m.

19. The method of claim 17, wherein a time taken for precharging the bit line at the bit line precharge nodes shortens, accordingly, as the number of the bit line precharge nodes for precharging the bit line increases.

20. The method of claim 19, wherein in a 2 bit MLC program operation where the verify operation is performed on the basis of first to third verify voltages, the bit line is precharged:

at the bit line precharge nodes for a first time until a first verify operation based on the first verify voltage is passed, at the bit line precharge nodes for a second time until a second verify operation based on a second verify voltage is passed after the first verify operation is passed, the second time being shorter than the first time, and at the bit line precharge nodes for a time, which reduces according to the number of a bit passed whenever a third verify operation is performed after the third verify operation based on the third verify voltage is performed.

* * * * *